United States Patent [19]
Ku

[11] Patent Number: 6,150,279
[45] Date of Patent: Nov. 21, 2000

[54] REVERSE CURRENT GOLD ETCH

[76] Inventor: Amy Ku, 22126 Linda Vista Pl., Cupertino, Calif. 95014

[21] Appl. No.: 09/102,903

[22] Filed: Jun. 23, 1998

[51] Int. Cl.$^7$ ....................................................... C23F 1/00
[52] U.S. Cl. ............................ 438/707; 438/745; 438/754
[58] Field of Search ..................................... 438/690, 689, 438/707, 5, 8, 745, 754

[56] References Cited

U.S. PATENT DOCUMENTS

| | | |
|---|---|---|
| 4,537,663 | 8/1985 | Macdonald .............................. 204/14.1 |
| 5,145,552 | 9/1992 | Yoshizawa et al. ..................... 156/638 |
| 5,221,421 | 6/1993 | Leibovitz et al. ...................... 156/642 |
| 5,406,318 | 4/1995 | Moore et al. .............................. 347/70 |
| 5,900,160 | 5/1999 | Whitesides et al. ....................... 216/41 |

*Primary Examiner*—Benjamin L. Utech
*Assistant Examiner*—Vanessa Perez-Ramos

[57] ABSTRACT

A method and apparatus for gold etching in semiconductor circuit manufacturing. An environmentally safe etching solution is used in an electroplating device to etch gold from a semiconductor substrate. The etching solution is free of iodine and cyanide based compounds and preferably includes thiourea.

16 Claims, 1 Drawing Sheet

REVERSE CURRENT GOLD ETCH

BACKGROUND OF THE INVENTION

The present invention generally relates to the fabrication of gold circuit patterns on a substrate and, more specifically, to the production of fine-geometry gold circuit patterns using an environmentally safe chemical etching method and apparatus.

Gold circuit patterns may be formed on a semiconductor substrate using techniques which are generally known in the art. Typically, a layer of photoresist is deposited on a seed layer of gold. Ultraviolet light is shined on the photoresist layer through a mask to define circuit patterns. The ultraviolet light hardens the photoresist layers in areas defined by the mask. Gold plating is then performed to deposit 6 to 7 microns of gold on top of the exposed seed layer of gold. The hardened photoresist on top of the seed layer of gold is 2–3 microns deep. Next, the hardened photoresist is removed exposing the seed layer of gold below the hardened photoresist. Finally, gold etching is performed to remove a portion of the electroplated gold and the exposed seed layer of gold. The gold etchant chemical solution is generally potassium iodide (iodine) or cyanide based.

In the gold etching process, a substrate is typically processed for 40 to 60 seconds in an etching solution that was previously heated to 50° C. The substrate is then inspected for bridging, etch rate, gold thickness, and coupler gap. The processing and inspection is repeated until all specifications are met (i.e., gap width, gold thickness, and cleanliness around boundary).

Iodine or cyanide based etching solutions are environmentally unsafe and require daily preparation by an operator. Gold reclaim requires that the post-etch solution has to be carefully labeled and filtered by an operator.

Etching gold with iodine and cyanide based solutions is generally limited to processing one or a small number of substrates at a time due to difficulty in controlling etch rate and uniformity. For example, when etching small geometric patterns, an operator must visually inspect the substrate during processing to minimize bridging. Further by way of example, to prevent over-etching, the operator must control the temperature of the etching solution to maintain constant etch rate. Bridging and over-etching both contribute to yield loss.

Accordingly, it is an object of the present invention to provide a novel etching apparatus for etching gold without using iodine or cyanide based chemicals.

It is another object of the present invention to provide a novel method of etching gold in which gold is etched using an iodine and cyanide free chemical.

It is yet another object of the present invention to provide a novel apparatus for manufacturing fine-geometric gold patterns using current flow.

It is still another object of the present invention to provide a novel solution for etching gold.

It is a further object of the present invention to provide a novel technique for etching gold using an environmentally safe etchant.

It is yet a further object of the present invention to provide a novel method and apparatus for maintaining a constant etching rate during gold circuit etching.

It is still a further object of the present invention to provide a novel apparatus and method for manufacturing gold circuit boards with increased lot size and reduced operator supervision.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
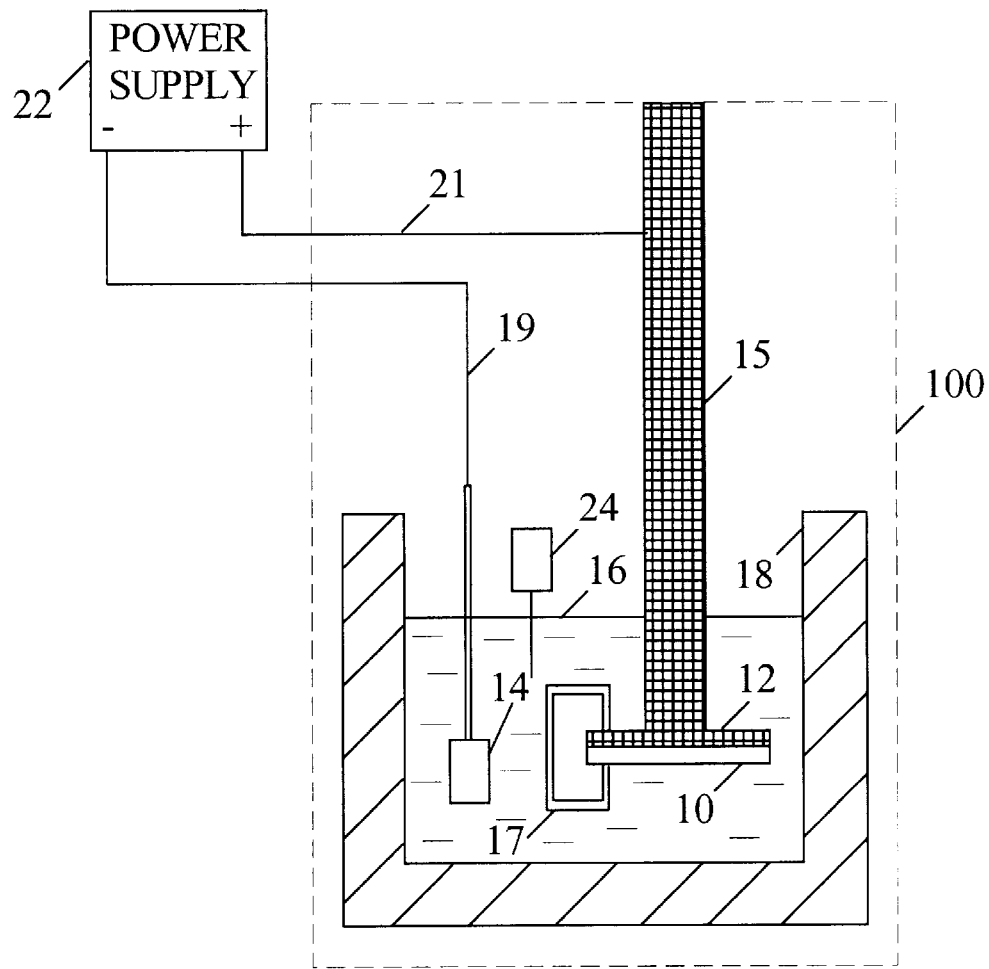
FIG. 1 is a schematic diagram of a gold etching apparatus illustrating one embodiment of the present invention.

With reference to FIG. 1, a gold etching apparatus 100 may include a substrate holder 12, an anode 14, and a tank 18 for holding an etching solution 16. The supporting structure 15 may be considered as being part of the substrate holder 12. Tank 18 is preferably an electroplating plating tank which may hold up to five gallons of the etching solution 16. Lines 19 and 21 each provide a connection to a pulse power supply 22.

The etching solution 16 is prepared using water and an iodine and cyanide free etchant, preferably thiourea. The solution may be mixed by an operator or mixed automatically by a machine. Large batches of the etching solution may be pre-mixed for use over several months. The etching solution may be prepared by mixing 1 pound of the etchant per gallon of water.

In operation, the etching solution 16 is heated, preferably to a temperature of 58° C. +/−2° C. A substrate 10 with a gold layer is mounted on the substrate holder 12. The back side of the substrate 10 may be protected by the substrate holder 12. The substrate holder 12 is immersed in the etching solution 16. The substrate 10 is moved, preferably in a rotating fashion, in the etching solution using the substrate holder 12 or the supporting structure 15. The anode 14 may be part of an electroplating apparatus. The anode 14 may be connected to the negative lead of the power supply 22 through line 19. The substrate holder 12 may be connected to the positive lead of the power supply 22 through line 22. A negative potential is applied to the anode 14 and a positive potential is applied to the substrate 10. Preferably, a positive potential is applied to an exposed surface of the substrate 10. The potential across the substrate and anode causes current flow (i.e., gold ions flow from the substrate to the anode).

Etch rate is monitored and controlled with an amp meter 24 by measuring the current flow in the tank 18. After a period sufficient to etch away the seed layer of gold, the power supply is turned off. The substrate 10 is moved to a hot deionized ("DI") water and rinsed. The substrate is then blow dried and inspected. Gap space and gold thickness are measured. If the seed layer of gold is not completely etched clean, the substrate is again etched in the gold etching apparatus 100.

Figure 2:
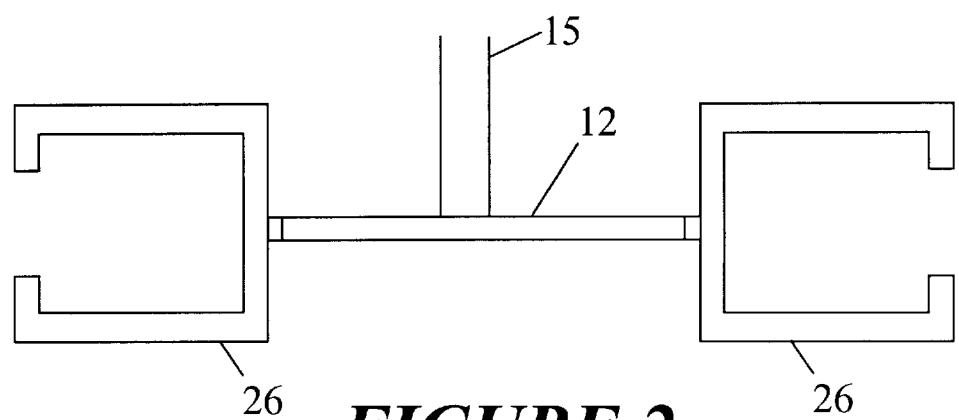
FIG. 2 is a schematic diagram of a substrate holder for a second embodiment of the present invention.

With reference now to FIG. 2, a substrate holder 12 may include plural grips 26 for holding a plurality of substrates for processing substrates in parallel. The grips 26 may be clamps, fasteners, or other holding apparatus that may be fixed to a substrate holder 12.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of etching gold from a surface of a substrate comprising the steps of:
   (a) holding an etchant bath in a container;
   (b) positioning the substrate and an anode in the etchant bath;
   (c) moving the substrate;
   (d) applying a sufficient amount of potential between the anode and the substrate to direct current flow from the substrate to the anode, to thereby etch gold from the substrate; and
   (e) collecting the etched gold at the anode.

2. The method of claim 1 further comprising the step of heating the etchant bath.

3. The method of claim 1 further comprising the step of protecting a bottom surface of the moving substrate.

4. The method of claim 1 wherein a positive potential is applied across a surface of the substrate having an exposed gold layer.

5. The method of claim 1 further comprising the step of monitoring etching rate.

6. The method of claim 5 wherein the electrical current in the etchant bath is measured to monitor etching rate.

7. The method of claim 1 further comprising the steps removing the substrate from the chemical bath; rinsing the substrate; drying the substrate using blown air; and inspecting the substrate.

8. The method of claim 7 wherein the steps of positioning the substrate, moving the substrate, and applying a potential are repeated in response to the step of inspecting the substrate.

9. The method of claim 1 wherein the etchant bath comprises non-toxic chemicals.

10. The method of claim 1 wherein the etchant bath comprises thiourea.

11. The method of claim 1 wherein the container is an electroplating tank.

12. The technique of claim 1 wherein the subtrate material is silicon.

13. The technique of claim 1 wherein the subtrate material is a ceramic.

14. A method of etching a gold layer from a substrate material comprising the steps of
   contacting said gold layer with an aqueous solution including thiourea and water, and
   passing a current through the substrate into the solution for a time sufficient to etch away said gold layer.

15. The method of claim 1, wherein the etchant bath comprises a cyanide and iodine free electrolytic bath including an aqueous solution holding thiourea.

16. A method for etching patterns on a substrate having a gold layer comprising the steps of:
   providing a container containing a chemical bath for etching the substrate;
   placing the substrate in a holder adapted to receive the substrate for positioning and moving the substrate in the container;
   immersing an anode in the chemical bath for collecting gold to be etched from the substrate;
   immersing the substrate to be etched in the chemical bath;
   directing a current of gold ions from the substrate to the anode through the chemical bath;
   moving the substrate in the chemical bath until a substantial portion of the gold is etched away from the substrate; and
   collecting the etched gold on the anode.

* * * * *